(12) United States Patent
Yoshida

(10) Patent No.: US 12,228,855 B2
(45) Date of Patent: Feb. 18, 2025

(54) IMPRINT APPARATUS, IMPRINT METHOD, ARTICLE MANUFACTURING METHOD, AND STORAGE MEDIUM

(71) Applicant: CANON KABUSHIKI KAISHA, Tokyo (JP)

(72) Inventor: Kenji Yoshida, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 3 days.

(21) Appl. No.: 17/542,834

(22) Filed: Dec. 6, 2021

(65) Prior Publication Data
US 2022/0187702 A1    Jun. 16, 2022

(30) Foreign Application Priority Data
Dec. 11, 2020    (JP) ................................ 2020-205610

(51) Int. Cl.
G03F 7/00    (2006.01)
(52) U.S. Cl.
CPC ................................ *G03F 7/0002* (2013.01)
(58) Field of Classification Search
None
See application file for complete search history.

(56) References Cited

U.S. PATENT DOCUMENTS

| | | | |
|---|---|---|---|
| 10,105,892 B2 | 10/2018 | Nakagawa | |
| 2012/0080820 A1* | 4/2012 | Narioka | G03F 7/0002 264/293 |
| 2015/0042012 A1* | 2/2015 | Nakagawa | G03F 7/0002 425/385 |
| 2015/0352776 A1* | 12/2015 | Ogasawara | G03F 7/0002 264/293 |
| 2016/0147143 A1 | 5/2016 | Ito et al. | |
| 2016/0151961 A1* | 6/2016 | Narioka | G03F 7/0002 425/210 |
| 2016/0297116 A1* | 10/2016 | Toyoshima | G03F 7/0002 |

(Continued)

FOREIGN PATENT DOCUMENTS

| | | |
|---|---|---|
| JP | 2013175631 A | 9/2013 |
| JP | 5868215 B2 | 2/2016 |

(Continued)

OTHER PUBLICATIONS

Office Action issued in Korean Appln. No. 10-2021-0167967, mailed Jun. 3, 2024. English translation provided.

*Primary Examiner* — Binu Thomas
(74) *Attorney, Agent, or Firm* — ROSSI, KIMMS & McDOWELL LLP

(57) ABSTRACT

An imprint apparatus capable of stably maintaining the concentration of gas supplied for imprint processing is provided even after the moving direction of a substrate is changed by comprising a gas supply port, and when the moving direction or the substrate is changed so that a next target shot region is to be imprinted, the substrate is moved to a position in the order of the next target shot region, the gas supply port, and the pattern region of a mold from the upstream in a predetermined direction, the substrate is then moved in the predetermined direction so that the next target shot region and the pattern region face each other while supplying the gas from the gas supply port, and then the next target shot region is imprinted by the pattern region.

9 Claims, 7 Drawing Sheets

(56) References Cited

U.S. PATENT DOCUMENTS

2016/0327857 A1\* 11/2016 Kimura ................ G03F 7/0002
2019/0094687 A1\* 3/2019 Narioka ................ G03F 7/0002
2019/0317398 A1 10/2019 Murakami

FOREIGN PATENT DOCUMENTS

| JP | 2018029101 A | 2/2018 |
| JP | 2019186477 A | 10/2019 |
| KR | 1020140116209 A | 10/2014 |
| KR | 1020160021274 A | 2/2016 |

\* cited by examiner

IMPRINT APPARATUS, IMPRINT METHOD, ARTICLE MANUFACTURING METHOD, AND STORAGE MEDIUM

BACKGROUND OF THE INVENTION

Field of the Invention

The present invention relates to for example, an imprint apparatus using a mold.

Description of the Related Art

A microfabrication technique in which uncured resin is molded on a substrate to form a pattern of resin on the substrate is attracting attention, in addition to conventional photolithography techniques, due to the increase in demand for miniaturization of semiconductor devices and MEMS (Micro Electronic Mechanical Systems). This technique is also referred to as an "imprint technique", by which a fine structure having a few nanometer-order can be formed on the substrate.

For example, one of the imprint techniques is a photo-curing method. In an imprint apparatus employing this photo-curing method, first, an ultraviolet curing resin (imprint material, photocurable resin) is coated on an imprint region (shot region) on a substrate. Next, this resin (uncured resin) is molded by a mold. Subsequently, ultraviolet ray is irradiated to cure the resin and the mold is separated, thereby a pattern of resin is formed on the substrate.

In such an imprint apparatus, when a fine concave-convex pattern formed on the mold is filled with resin while pressing of the mold against the resin on the substrate, unfilled portions are generated due to residual bubbles, and thereby, a normal resin pattern may not be formed. Accordingly, there has been proposed an imprint apparatus that reduces the residual bubbles by filling a gap space between the mold and the substrate with gas (hereinafter, referred to as "replacement gas") having high solubility, high diffusively, or having both, curing the pressing of the mold against the resin on the substrate.

Japanese Patent No. 5868215 discloses a method for efficiently supplying a replacement gas based on a distance from a mold to a gas supply unit and a distance from an imprint region to an end face of a substrate holding unit. Additionally, Japanese Patent Laid-open No. 2019-186477 discloses a method for reducing an amount of consumption of the replacement gas by reducing a distance between the mold and the substrate during movement between shot regions rather than the distance between the mold and the substrate when the replacement gas is supplied.

However, in the conventional exposure apparatuses, it is difficult to maintain the concentration of the replacement gas in the shot regions when imprinting is continuously performed over a plurality of shot regions, and it is necessary to increase the time for filling so as to avoid the occurrence of a defect due to an unfilled portion in some shot region. Additionally, there has been a similar problem in maintaining the concentration of the replacement gas in the first imprinting after the substrate is carried in, where the moving direction of the substrate is significantly changed.

SUMMARY OF THE INVENTION

An object of the present invention is to provide an imprint apparatus capable of stably maintaining the concentration of a gas supplied for imprint processing even after the moving direction of a substrate is changed.

An imprint apparatus according to one aspect of the present invention is an imprint apparatus that performs imprint processing for forming a pattern by bringing a pattern region of a mold into contact with an imprint material on a substrate comprising:

a substrate driving unit for moving the substrate; and a gas supply port provided at the periphery of the pattern region and for supplying gas to a space between the pattern region and the substrate, further comprising:

at least one processor or circuit configured to function as:

a control unit configured to perform control so that, in a case where the moving direction of the substrate by the substrate drive unit is changed so that a next target shot region is to be imprinted by the imprint processing, the substrate is moved to a position in the order of the next target shot region, the gas supply port, and the pattern region from the upstream in a predetermined direction, the substrate is then moved in the predetermined direction by the substrate driving unit so that the next target shot region and the pattern region face each other while supplying the gas from the gas supply port, and then the pattern region is brought into contact with the imprint material on the next target shot region of the substrate.

Further features of the present invention will become apparent from the following description of embodiments with reference to the attached drawings.

BRIEF DESCRIPTION OF THE DRAWINGS

FIG. 3A illustrates a state in which the substrate holding unit 5 is moved after a substrate 12 is carried in and the position on the substrate 12 is detected. FIG. 3B illustrates a state in which the substrate holding unit 5 is driven along a drive direction 30 while the replacement gas 16 is supplied from a gas supply port 17a. FIG. 3C illustrates a state in which the replacement gas 16 is supplied to the space between a target shot region 29a and a pattern region 9a during imprint processing after the target shot region 29a moves directly under the pattern region 9a.

FIGS. 4A and 4B illustrate examples of the operation following FIG. 3, in which FIG. 4A illustrates a state immediately after the imprint processing for the target shot region 29a is completed and the mold is released, and FIG. 4B illustrates a state when the target shot region 29b arrives directly under the pattern region 9a.

FIG. 5A illustrates a state immediately after the imprint processing is performed on the target shot region 29c and FIG. 5B illustrates a slate in which the replacement gas 16 insufficiently reaches the target shot region 29d.

FIG. 6A illustrates a suite in which the substrate holding unit 5 is driven in the direction of a driving direction 33 after the imprint processing is performed on the target shot region 29c, FIG. 6B illustrates a state in which the target shot region 29d, the gas supply port 17b, and the pattern region 9a are temporarily arranged in this order upstream from the driving direction 34, and FIG. 6C illustrates a state in which the space between the pattern region 9a and the target shot region 29d is filled with the replacement gas 16 having a sufficient concentration.

DESCRIPTION OF THE EMBODIMENTS

Hereinafter, with reference to the accompanying drawings, favorable mode of the present invention will be described using Embodiments. In each diagram, the same reference signs are applied to the same members or elements, and duplicate description will be omitted or simplified.

Figure 1:
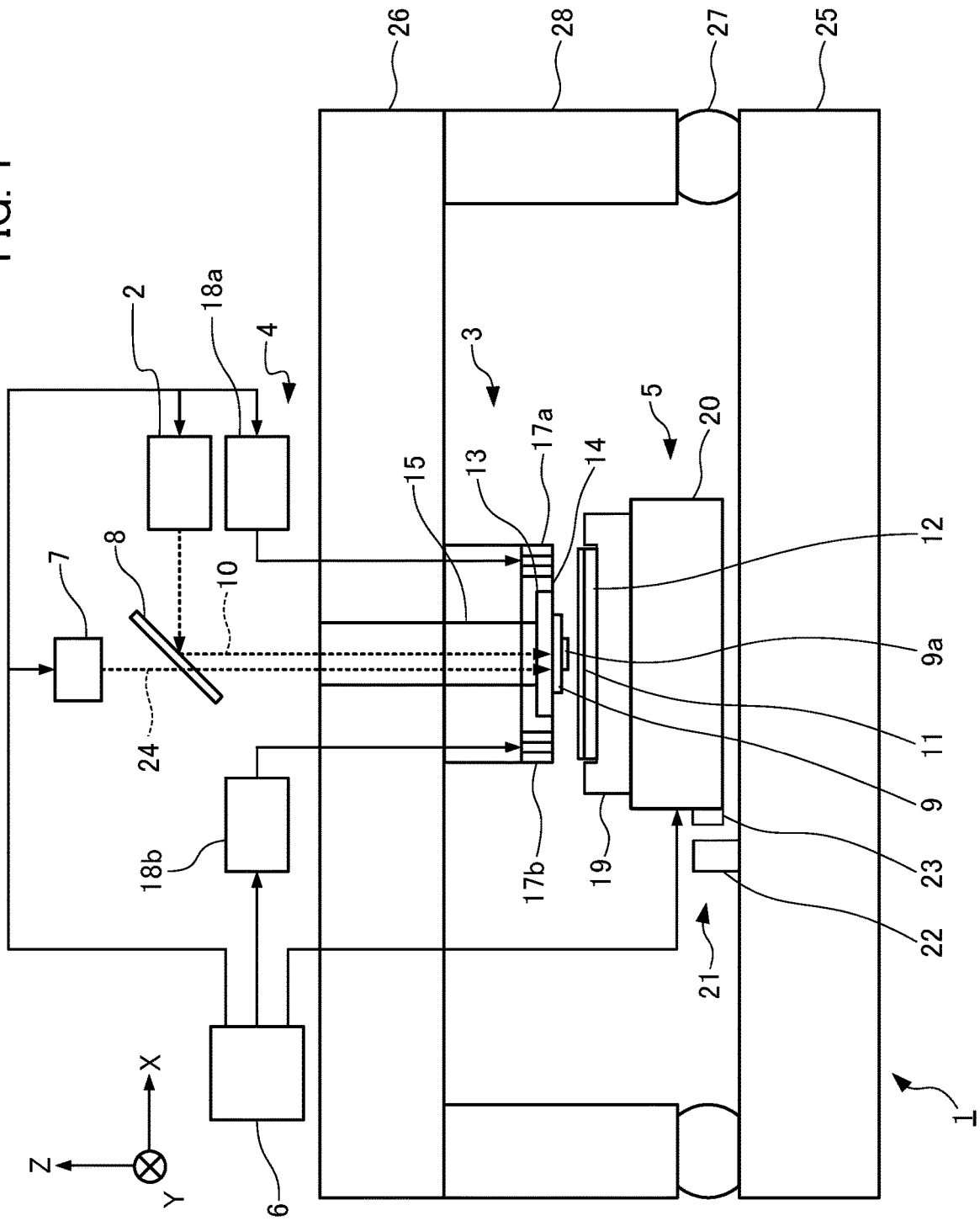
FIG. 1 is a schematic diagram illustrating a configuration of an imprint apparatus according to the present embodiment.

First, an imprint apparatus according to the first embodiment of the present invention will be described. FIG. 1 is a schematic diagram illustrating a configuration of an imprint apparatus 1 according to the present embodiment. The imprint apparatus 1 is used for manufacturing devices such as a semiconductor device as an article, and performs the imprint processing for forming a pattern by bringing a pattern region of a mold into contact with an uncured imprint material on a substrate, which is a substrate to be processed.

In the present embodiment, an imprint apparatus employing a photo-curing method will be described. In the drawings below, the Z-axis is parallel to the optical axis of an illumination system that irradiates the imprint material on the substrate with ultraviolet ray, and the X-axis and the Y-axis are orthogonal to each other in a plane perpendicular to the Z-axis. The imprint apparatus 1 includes a light irradiation unit 2, a mold holding unit 3, a gas supply unit 4, a substrate holding unit 5, a controller 6, and an alignment measurement unit 7.

In the imprint processing, the light irradiation unit 2 irradiates a dichroic mirror 8 and a transparent mold 9 with ultraviolet ray 10. The light irradiation unit 2 includes a light source (not illustrated) and an illumination optical system that adjusts an amount of light of an ultraviolet ray 10 emitted from the light source to an amount of light suitable for curing the imprint material, and irradiates the mold 9. Although a lamp, for example, a mercury lamp, is employed as the light source, the type of light source is not limited in particular if the light source transmits through the mold 9 and emits light having a wavelength at which an imprint material 11 to be described below is hardened.

The illumination optical system may include a lens, a mirror, an aperture, or a shutter for switching between irradiation and light-shielding. In the present embodiment, the light irradiation unit 2 is provided for employing the photo-curing method. However, when, for example, the photo-curing method is employed, a heat source unit for curing an imprint material is provided instead of the light irradiation unit 2.

The peripheral shape of the mold 9 is polygonal (preferably, rectangular or square), and includes the pattern region 9a on a surface facing the substrate 12 on which a concave-convex pattern to be transferred, for example, a circuit pattern, is formed in a three-dimensional shape. There are various pattern sizes depending on an article to be manufactured, in which a fine pattern of lens of nanometers is included. The pattern of the surface of the mold includes a flat surface.

The material of the mold 9 is preferably capable of transmitting the ultraviolet ray 10 and preferably has a low coefficient of thermal expansion, and may be, for example, quart. Further, the mold 9 may have a cavity having a circular planar shape and a certain depth on the surface irradiated by the ultraviolet ray 10.

The mold holding unit 3 has a mold suction unit 13 that holds the mold 9, a mold driving unit 14 that movably holds the mold suction unit 13, and a magnification correction mechanism (not illustrated) for correcting the shape of the mold 9 (pattern region 9a). The mold suction unit 13 can hold the mold 9 by attracting the outer peripheral region of the surface irradiated by the ultraviolet ray 10 in the mold 9 by a vacuum suction force or an electrostatic force.

For example, when the mold 9 is held by a vacuum suction force, the mold suction unit 13 is connected to a vacuum pump (not illustrated) installed outside, and a suction force (holding force) to the mold 9 can be adjusted by appropriately adjusting a suction pressure by evacuation of the vacuum pump.

The mold driving unit 14 moves the mold 9 in each axial direction so as to selectively press or separate the mold 9 against or from the imprint material 11 on the substrate 12. A power source that can be employed for this mold drive unit 14 is, for example, a linear motor and an air cylinder.

Additionally, the mold driving unit 14 can be configured by a plurality of driving systems such as a coarse motion system and a fine motion system in order to correspond to the positioning of the mold 9 with a high accuracy. Further, the mold driving unit 14 may have a position adjustment function not only in the Z-axis direction but also in the X-axis direction, the Y-axis direction, or the θ (rotation around the Z axis) direction, and a tilt function for correcting the tilting of the mold 9.

The pressing and separating operations in the imprint apparatus 1 may be realized by moving the mold 9 in the Z axis direction or may be realized by moving the substrate holding unit 5 in the Z axis direction, or realized by relatively moving both the mold 9 and the substrate holding unit 5. The position of the mold 9 when the mold driving unit 14 is driven can be measured by position measuring units such as an optical displacement meter (not illustrated) that measures the distance between the mold 9 and the substrate 12.

The magnification correction mechanism is disposed on a side of the mold suction unit 13 on which the mold 9 is held, and corrects the shape of the mold 9 (pattern region 9a) by mechanically applying an external force or displacement to the side surface of the mold 9. Further, the mold suction unit 13 and the mold driving unit 14 have an opening region 15 at the center portion (inner side) in the plane direction, and the ultraviolet ray 10 irradiated from the light irradiation unit 2 can irradiate the imprint material 11 on the substrate 12 through the mold 9 via the opening region 15.

The gas supply unit 4 supplies the replacement gas 16 as a predetermined gas to a space between the mold 9 and the substrate 12 during pressing operation. This is for improving the filling property by shortening the time required for filling the concave-convex pattern of the pattern region 9a with the imprint material 11, and by suppressing the residual bubbles in the filled portion. Additionally, the gas supply unit 4 can supply the replacement gas 16 even during the separating operation in order to reduce a separation force as much as possible and improve the mold releasability.

Figure 2:
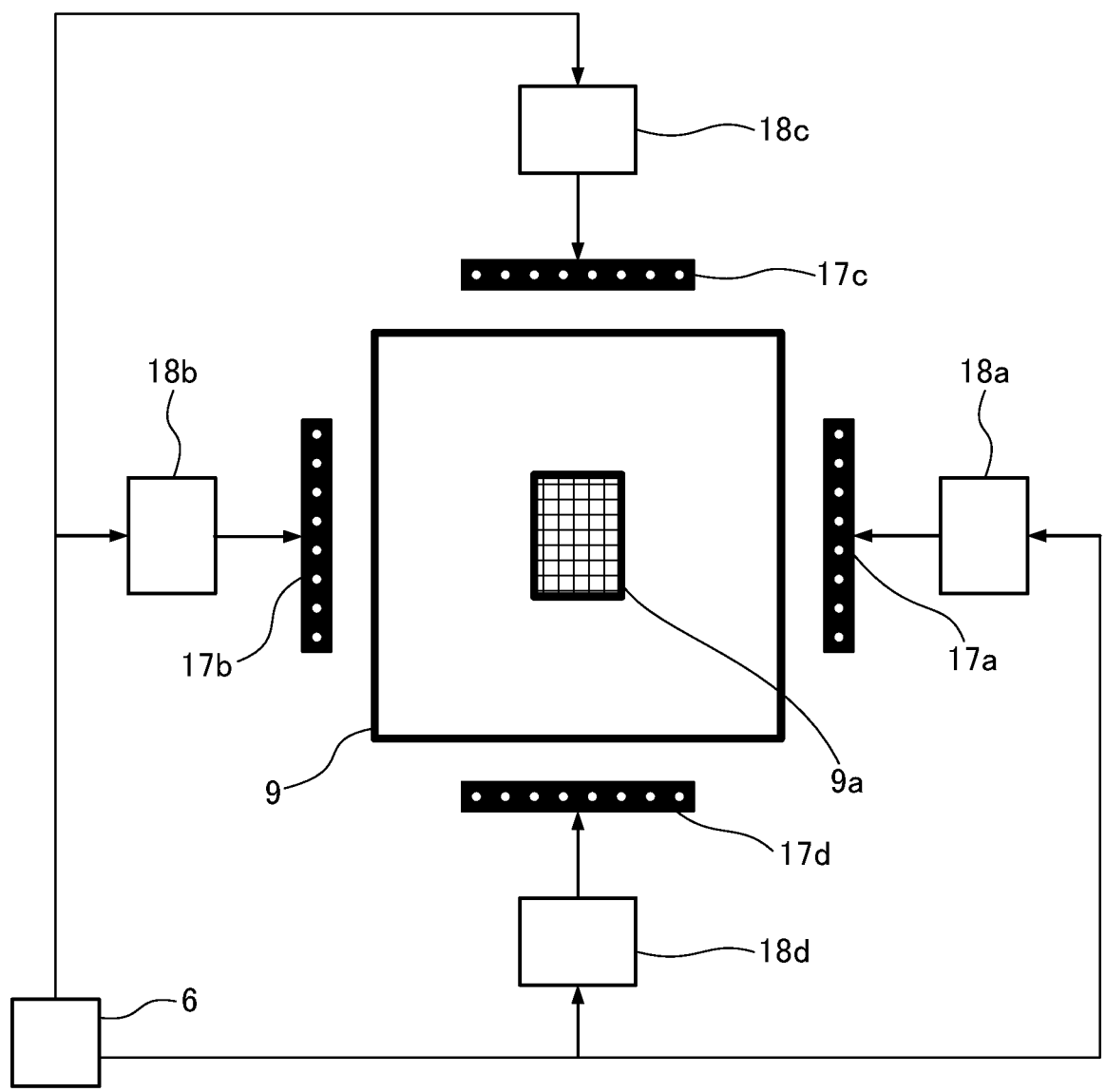
FIG. 2 illustrates a gas supply unit 4 of the present embodiment viewed from below.

FIG. 2 illustrates the gas supply unit 4 viewed from below. As shown in FIG. 2, the gas supply unit 4 of the present embodiment is disposed near the four side surfaces of the mold 9, and has a plurality of gas supply ports 17a to 17d for supplying the replacement gas 16 toward the substrate holding unit 5. Additionally, there is provided with a plurality of gas controllers 18a to 18d each connected to the gas supply pons 17a to 17d, which adjusts a supply amount, a concentration, and the like of the replacement gas 16.

In particular, the gas supply unit 4 of the present embodiment includes a first supply port 17a and a second supply port 17b respectively disposed in the vicinity of both side surfaces of the mold 9 in the X-axis direction, and a third supply port 17c and a fourth supply port 17d respectively disposed in the vicinity of both side surfaces of the mold 9 in the Y-axis direction.

The supply ports 17a to 17d each have a plurality of supply holes. The plurality of gas supply ports 17a to 17d are provided around the pattern region and function as gas supply pons for supplying a predetermined gas (replacement gas) to a space between the pattern region and the substrate.

The first supply port 17a is connected to the first gas controller 18a, the second supply port 17b is connected to the second gas controller 18b, the third supply port 17c is connected to the third gas controller 18c, and the fourth supply port 17d is connected to the fourth gas controller 18d. The gas controllers 18a, 18b, 18c, and 18d are each connected to the controller 6. The replacement gas 16 to be used is a gas having high solubility and diffusivity in the resin 11, a permeable gas, a condensable gas, or a gas obtained by mixing both, in view of the above features in filling and mold-releasing.

That is, for example, a gas containing at least one of helium, carbon dioxide, nitrogen, hydrogen, xenon, pentafluoropropane, hydrofluorocarbon, and hydrofluoroether is used as the replacement gas 16.

The substrate 12 is, for example, a single crystal silicon substrate, an SOI (Silicon on Insulator) substrate, or a glass substrate. In a plurality of shot regions that are pattern forming regions on the substrate 12, patterns (layers including patterns) of the imprint material 11 are each formed by the pattern region 9a.

The substrate holding unit 5 is movable while holding the substrate 12, and performs, for example, positioning between the pattern region 9a and the shot region when the mold 9 is pressed against the imprint material 11 on the substrate 12. The substrate holding unit 5 has a substrate suction unit 19 that holds the substrate 12 by a suction force and a substrate driving unit 20 that mechanically holds the substrate suction unit 19 and can move the substrate suction unit 19 in each axial direction. The substrate suction unit 19 supports the rear surface of the substrate 12 by, for example, a plurality of pins having uniform height, and holds the substrate 12 by reducing the pressure of a part other than the pins by evacuation.

The substrate driving unit 20 is a power source with less vibration during driving and during rest, and examples of the power source include a linear motor and a plane motor. The substrate driving unit 20 may also be configured by a plurality of driving systems such as a coarse motion system and a fine motion system in each direction of the X-axis and the Y-axis. Further, the substrate driving unit 20 may be configured to have a drive system for adjusting the position of the substrate 12 in the Z-axis direction, a function for adjusting the position of the substrate 12 in the θ-direction, a tilting function for correcting the tilting of the substrate 12, and the like.

In order to measure the position of be substrate holding unit 5, an encoder system 21 corresponding to each direction of the X axis, the Y axis and the Z axis is arranged. The encoder system 21 can measure the position of the substrate holding unit 5 by irradiating a beam from an encoder head 22 to an encoder scale 23. The encoder system 21 measures the position of the substrate holding unit 5 in real time.

The controller 6 can control the operation and adjustment of each component of the imprint apparatus 1. The controller 6 is configured by a computer such as a CPU and is connected to each component of the imprint apparatus 1 via a line.

Figure 7:
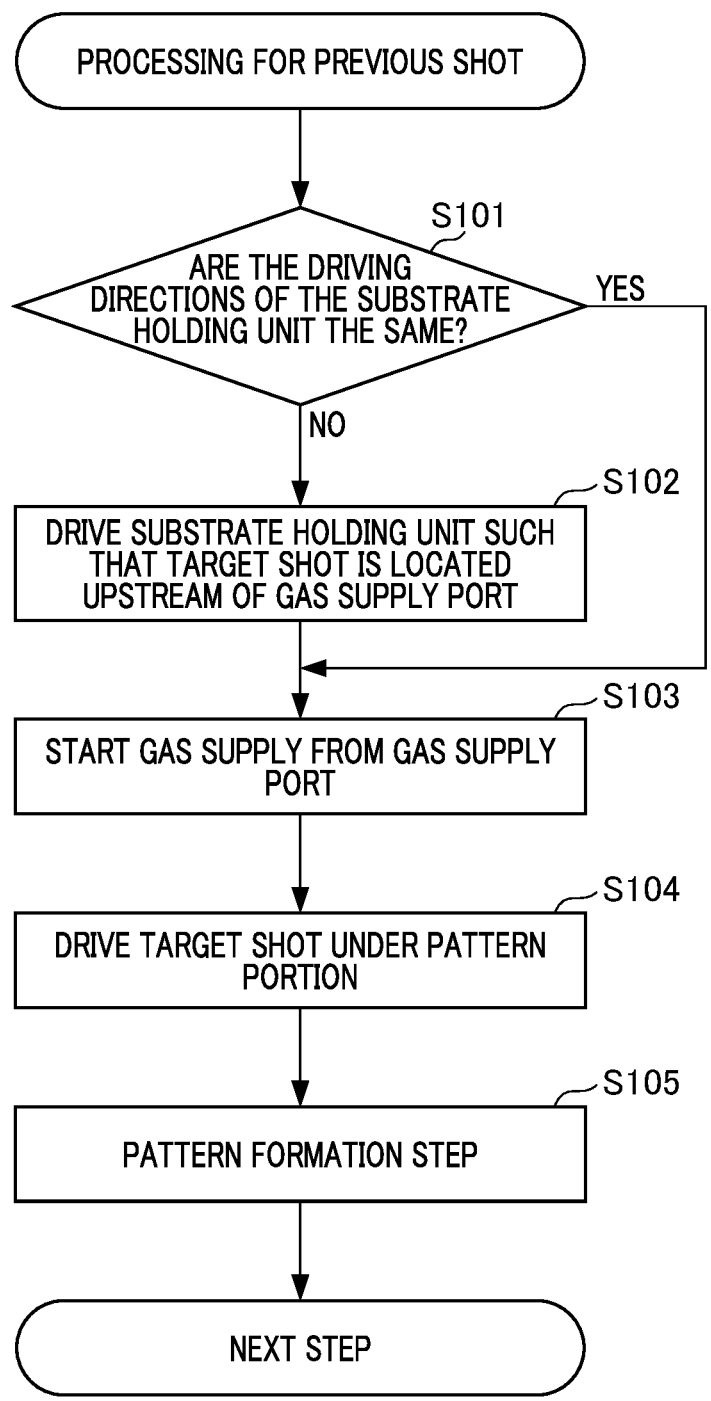
FIG. 7 is a flow chart showing the flow of the gas supply step of the present embodiment.

Additionally, the controller 6 can execute control for each component according to a computer program stored in a memory (not illustrated) as shown in, for example, the flowchart of FIG. 7. The controller 6 of the present embodiment controls the operation for at least the gas supply unit 4 and the substrate holding unit 5. The controller 6 may be integrally configured with the other parts of the imprint apparatus 1 (in a common housing) or may be formed separately from the other parts of the imprint apparatus 1 (in a different housing).

In the imprint processing, the alignment measurement unit 7 measures the positional deviation between the mold 9 and the substrate 12 by irradiating the mold 9 and the substrate 12 with alignment light 24 and detecting light from alignment marks formed on the mold 9 and the substrate 12.

The imprint apparatus 1 is also provided with a surface plate 25 on which the substrate holding unit 5 is disposed and that forms a reference plane, a bridge surface plate 26 that fixes the mold holding unit 3, and a support 28 that extends from the surface plate 25 and supports the bridge surface plate 26 via a vibration isolator 27 that removes vibration from the floor surface. Further, the imprint apparatus 1 may include a mold conveyance mechanism (not illustrated) that conveys the mold 9 between the outside of the imprint apparatus and the mold holding unit 3, and a substrate conveyance mechanism (not illustrated) that conveys the substrate 12 between the outside of the imprint apparatus and the substrate holding unit 5.

Next, the imprint processing (imprint method) performed by the imprint apparatus 1 will be described. First, the controller 6 causes a substrate transport mechanism to place and fix the substrate 12 on the substrate suction unit 19. It is assumed that the substrate 12 is coated with the imprint material 11 in advance. Next, the controller 6 drives the substrate driving unit 20 to appropriately change the position of the substrate 12, and causes the alignment measuring unit 7 to sequentially measure the alignment marks on the substrate 12 to detect the position of the substrate 12 with a high accuracy.

Subsequently, the controller 6 calculates each transfer coordinate based on the detection result, and based on the calculation result, patterns for each predetermined shot region are sequentially formed. As a flow of pattern formation for one shot region, the controller 6 first causes the substrate driving unit 20 to move and position the substrate 12 so that the shot region is located at a pressing position directly under the pattern region 9a.

Next, the controller 6 performs positioning for the pattern region 9a and the shot region, and then drives the mold driving unit 14 to press the pattern region 9a against the imprint material 11 on the shot region (mold pressing step). Due to this pressing, the imprint material 11 is filled in the concave-convex pattern of the pattern region 9a.

The controller 6 determines whether or not the pressing has been completed by a load sensor (not illustrated) installed inside the mold holding unit 3. In this state, the light irradiation unit 2 performs irradiation with ultraviolet ray 10 from the back surface (upper surface) of the mold 9 for a predetermined time, and as a result, the imprint material 11 is cured by the ultraviolet ray 10 that has been transmitted through the mold 9 (curing step).

After the imprint material 11 has been cured, the controller 6 drives the mold driving unit 14 again to separate the pattern region 9a from the substrate 12 (mold releasing step). Thus, a three-dimensional resin pattern (laser) following the concave-convex pattern of the pattern region 9a is formed on the surface of the shot region on the substrate 12.

By performing such a series of imprint processing operations a plurality of times while changing the shot regions by driving the substrate holding unit 5, the imprint apparatus 1 can form a plurality of patterns of the imprint material on one substrate 12. In the present embodiment, although it is assumed that the substrate 12 has already been coated with the imprint material 11, a coating step for coating a predetermined region on the substrate 12 with the imprint material 11 may be provided as one step of the imprinting processing in the imprint apparatus 1.

In the above mold pressing step, when the mold 9 is pressed against the imprint material 11 on the substrate 12, the imprint material 11 needs to be uniformly filled into the concave-convex pattern of the pattern region 9a. However, there are cases in which bubbles remain in the imprint material 11, and if the imprint material 11 is cured in that state, the pattern of the imprint material formed on the shot region may not have a desired shape. As a result, there are cases in which a defect occurs in manufactured articles such as a semiconductor device.

Accordingly, during pressing (at least when pressing starts), the gas supply unit 4 supplies the replacement gas 16 to the space between the mold 9 and the substrate 12, as described above. Accordingly, the concentration of the replacement gas in the vicinity of the pattern region 9a becomes sufficiently high, for example, 70% or more, with the passage of a predetermined time, due to the diffusion effect of the replacement gas 16 itself, thereby the residual bubbles can be efficiently suppressed.

However, in the method for suppressing the residual bubbles by such a gas filling method, a predetermined waiting time is conventionally required until the gas concentration becomes sufficiently high in the space between the mold 9 and the substrate 12. For example, although this waiting time may vary depending on the surrounding configuration of the mold 9 and the required gas concentration, the waiting time is from one second to several ten seconds or more, assuming a typical imprint apparatus is used.

That is, since this waiting time may affect the production efficiency of the imprint apparatus, it is desirable that the waiting time is shortened as much as possible. Accordingly, in the imprint apparatus 1 of the present embodiment, the operation below is executed when the replacement gas 16 is supplied in order to increase the concentration of the replacement gas in the space between the mold 9 and the substrate 12 more quickly.

First, assuming that the target shot region 29 that is a target for the imprint processing this time is present on the substrate 12, the operation of the imprint apparatus 1 will be described in each time series with reference to FIG. 3 to FIG. 6. FIG. 3 to FIG. 6 respectively illustrate the supply operation of the replacement gas 16 by the gas supply unit 4 and the driving operation of the substrate holding unit 5 during movement of the target shot region 29 to the pressing position directly under the pattern region 9a. FIG. 3 to FIG. 6 are diagrams all viewed from the + side to − side in the Z-axis direction of FIG. 1.

Figure 3A:
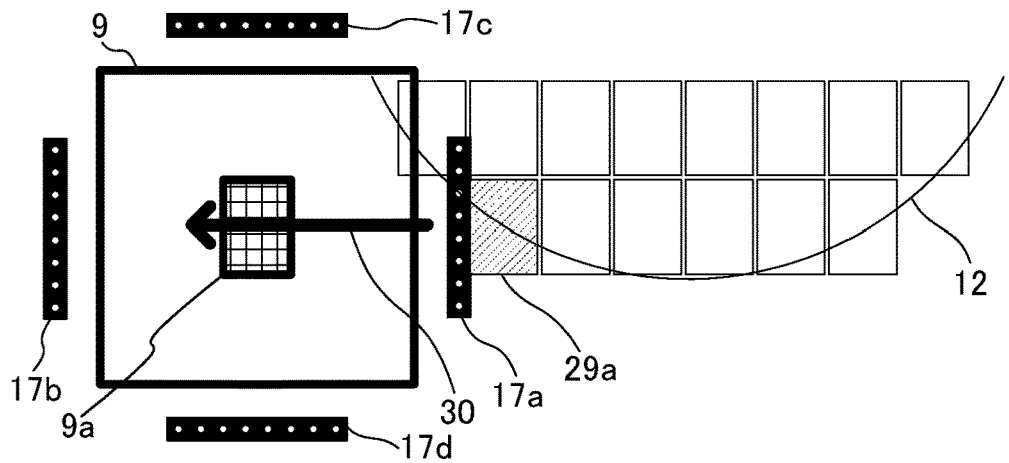
FIGS. 3A, 3B, and 3C illustrate examples of a supply operation of a replacement gas 16, and a drive operation of a substrate holding unit 5 to a first shot region of the present embodiment.

FIG. 3 illustrates an example of the supply operation of the replacement gas 16 and the driving operation of the substrate holding unit 5 respectively performed on the first shot region (initial shot region) in the present embodiment, and illustrates an operation when the first shot region is the target shot region 29a. The controller 6 carries-in the substrate 12, detects the position on the substrate 12, and then drives the substrate holding unit 5 to the position shown in FIG. 3A. At this time, the moving direction of the substrate is changed by carrying the substrate in the imprint apparatus.

Subsequently, the substrate driving unit moves the substrate in a predetermined direction (drive direction 30) for the target shot region 29a where the imprint processing is to be performed first. That is, next, the substrate holding unit 5 moves the substrate 12 from right to left along the drive direction 30. At this time, the substrate holding unit 5 is driven so that the target shot region 29a of the substrate 12 passes under the gas supply port 17a, and further moves directly under the pattern region 9a of the mold 9.

In the example of FIG. 3, the controller 6 selects the gas supply port 17a located upstream of the pattern region 9a in the drive direction 30 to serve as the gas supply port. That is, a predetermined gas is supplied front at least a gas supply port disposed between the target shot region and the pattern region from among the plurality of gas supply ports. When the target shot region passes through the gas supply port or before the target shot region passes through the gas supply port, a predetermined gas is supplied through the gas supply port, and the predetermined gas is supplied even during the imprint processing.

Figure 3B:
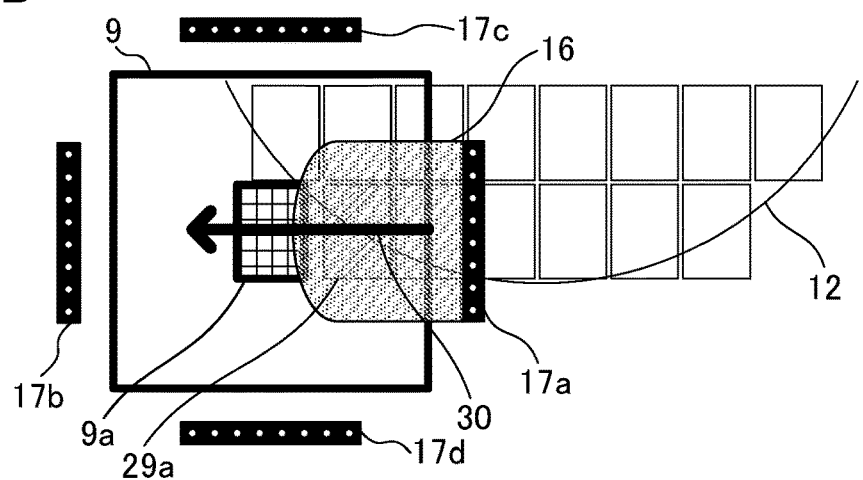

Subsequently, as shown in FIG. 3B, the controller 6 drives the substrate holding unit 5 along the drive direction 30 while supplying the replacement gas 16 from the gas supply port 17a. At this time, the replacement gas 16 is drawn into the space between the mold 9 and the target shot region 29a according to the drive of the substrate holding unit 5. That is, a Couette flow is generated in the gas supplied from the gas supply port to draw the gas under the mold.

Figure 3C:
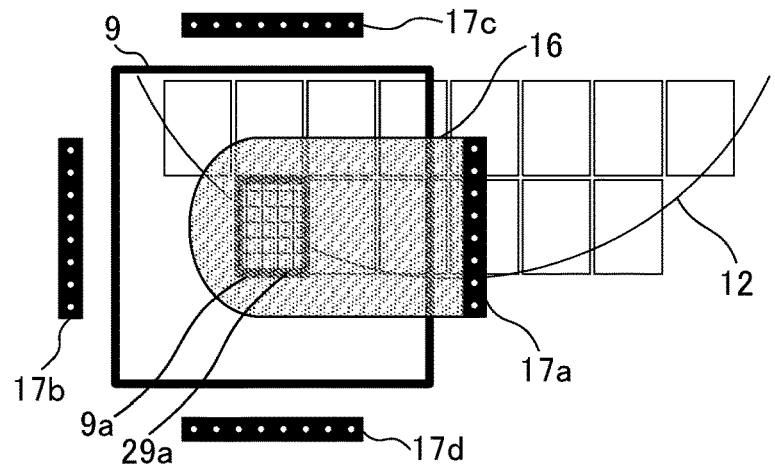

Even during the imprinting processing after the target shot region 29a has moved directly under the pattern region 9a, the replacement gas 16 is supplied to the space between the target shot region 29a and the pattern region 9a (FIG. 3C).

Due to this control, in the space between the pattern region 9a and the target shot region 29a, a replacement gas concentration that is sufficient to suppress the residual bubbles during the pressing of the mold 9 can be obtained. In this state, the imprint processing is executed in which the mold 9 is pressed against the imprint material of the target shot region 29a to form a pattern.

As described above, according to the present embodiment, control is performed such that the imprint processing is performed after the gas supply port located at the upstream side in the moving direction from among the plurality of supply ports passes through a position facing the first shot region where the imprint processing is to be performed first after the substrate is supplied.

Specifically, the substrate is moved so that the target shot region, the gas supply port, and the pattern region are arranged in this order from the upstream in the moving direction, and then the substrate is moved in the predetermined direction while a predetermined gas is supplied from the gas supply port. Then, the imprint processing is performed while facing the target shot region and the pattern region, and thereby defects in pattern formation are less likely to occur.

Figure 4A:
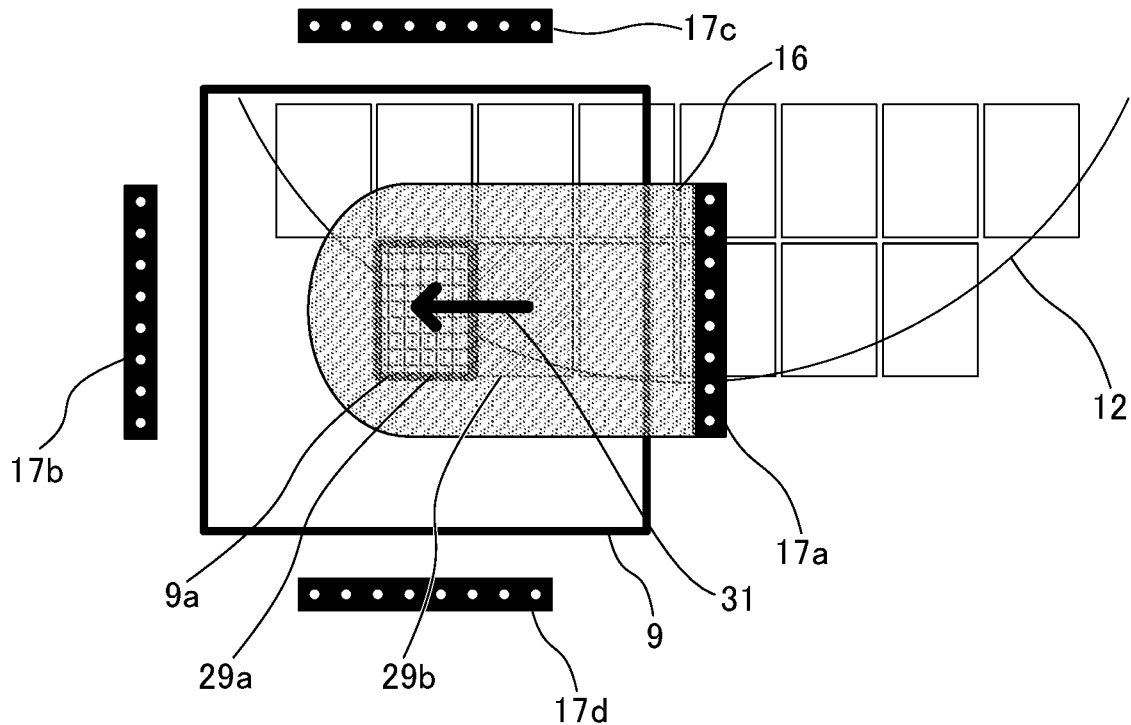

Next, FIG. 4 illustrates an example of operations subsequent to FIG. 3, in which an operation when the next target shot region 29b is placed to the right of FIG. 3 after the operation in FIG. 3c will be described with reference to FIG. 4. FIG. 4A illustrates a slate immediately after the imprint processing on the target shot region 29a is completed and the mold is released. At this time, the controller 6 drives the substrate holding unit 5 in a driving direction 31 in order to move the target shot region 29b directly under the pattern region 9a.

The driving direction 31 is the same as the drive direction 30 of the substrate holding unit 5 when the target shot region 29b is moved directly under the pattern region 9a. Therefore, the controller 6 drives the substrate holding unit 5 while supplying the replacement gas 16 from the gas supply port 17a located upstream of the pattern region 9a in the driving direction 31 of the substrate holding unit 5.

Figure 4B:
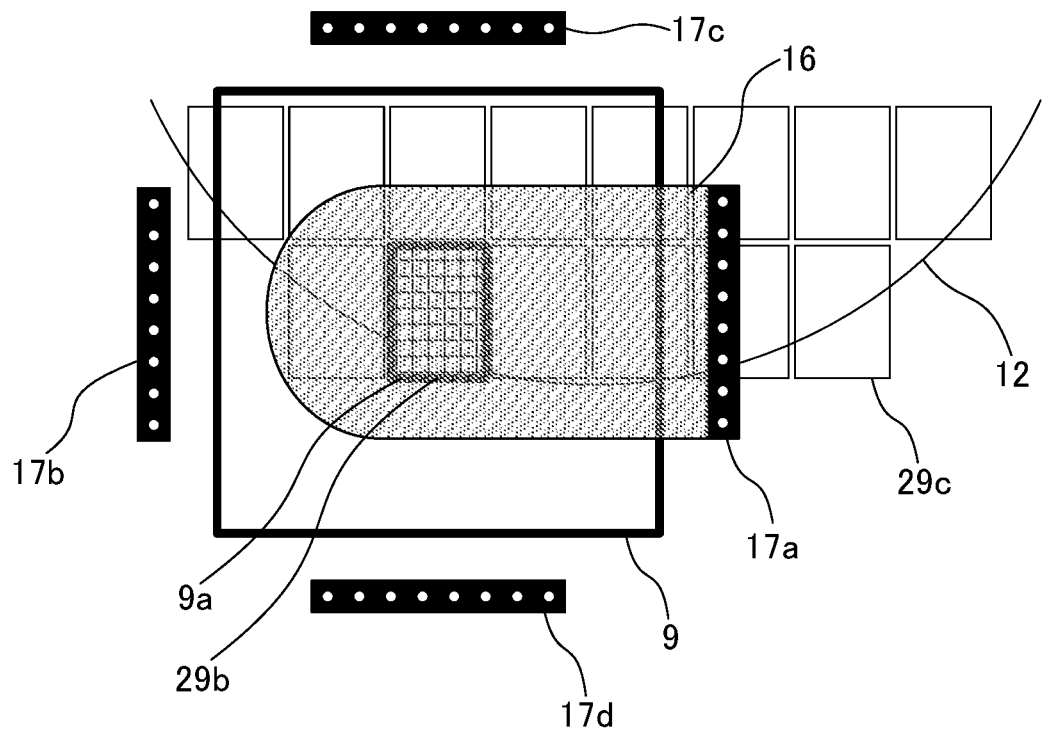

At this time, the substrate holding unit 5 is driven to draw the replacement gas 16 that has already been filled in the space between the mold 9, the substrate 12, and the substrate holding unit 5, and the replacement gas 16 supplied from the gas supply port 17a downstream in the driving direction 31. FIG. 4B illustrates a case in which the target shot region 29b arrives directly under the pattern region 9a. As shown in FIG. 4B, the replacement gas 16 is supplied to the space between the pattern region 9a and the target shot region 29b while maintaining a sufficient concentration.

Figure 5A:
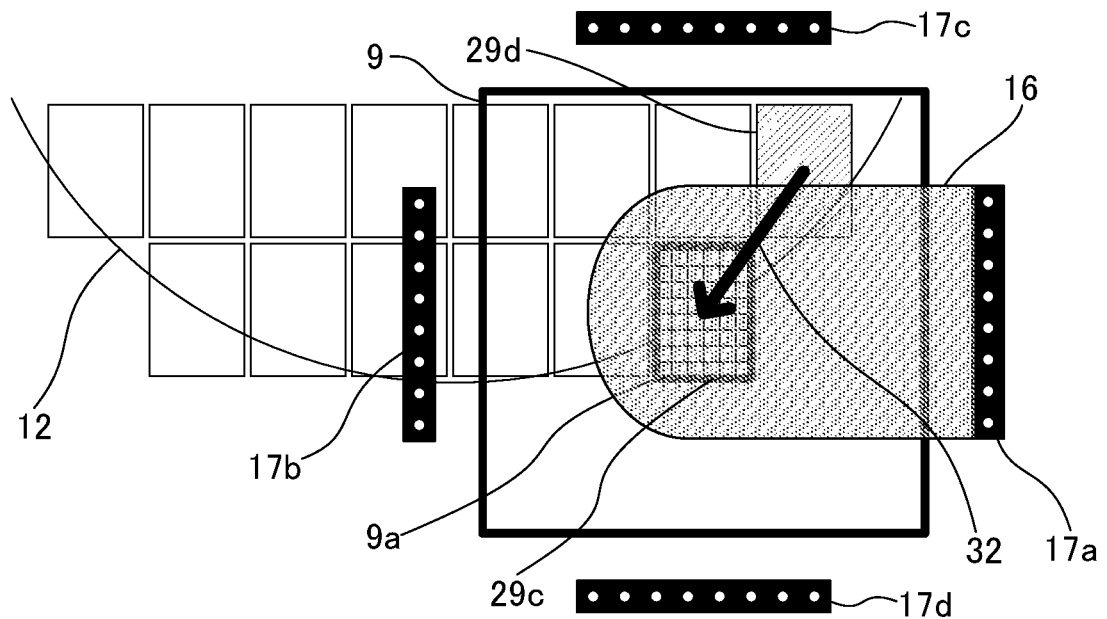
FIGS. 5A and 5B illustrate operation examples when the substrate driving direction is switched.

After the imprint processing for the target shot region 29b, the imprint processing is sequentially performed on the target shot regions in the same manner as the target shot region 29b, and the imprint processing is performed up to the target shot region 29c shown in FIG. 5A. FIG. 5 illustrates an operation example when the substrate driving direction is switched.

With reference to FIG. 5, an operation in imprinting the next target shot region 29d after the imprinting processing for the target shot region 29c will be described. FIG. 5A illustrates a state immediately after the imprint processing is performed on the target shot region 29c. Here, in order to move the next target shot region 29d directly under the pattern region 9a, the controller 6 drives the substrate holding unit 5 in a direction, for example, in a driving direction 32, which is different from the driving direction 31 (shown in FIG. 4A) of the substrate holding unit 5 from the target shot region 29a to the target shot region 29c.

Figure 5B:
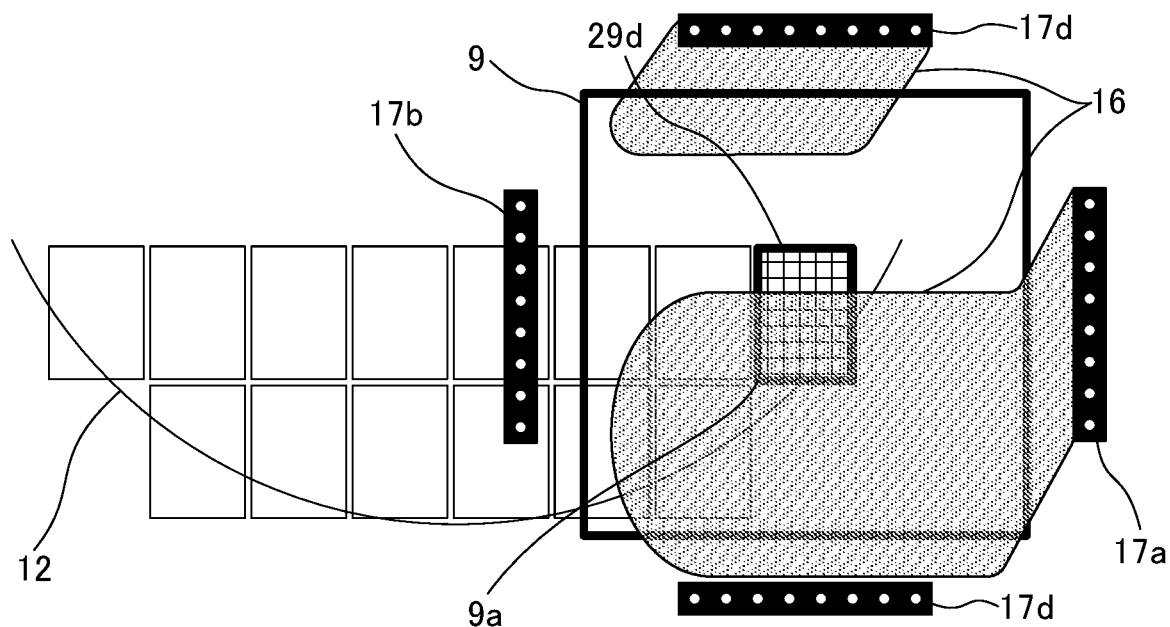

However, in the above-described method, the replacement gas 16 is drawn in the direction of the driving direction 32 and it is difficult to maintain a sufficient replacement gas concentration in the space between the target shot region 29d and the pattern region 9a. Additionally, even if the replacement gas 16 is supplied not only from the gas supply port 17a but also from the gas supply port 17c at the same time, the replacement gas 16 insufficiently reaches the target shot region 29d as shown in FIG. 5B.

Hence, in the example of FIG. 5, it is necessary to wait until the space between the pattern region 9a and the target shot region 29d is filled with the replacement gas 16 at a sufficient concentration while the replacement gas 16 is supplied from the gas supply port.

Figure 6A:
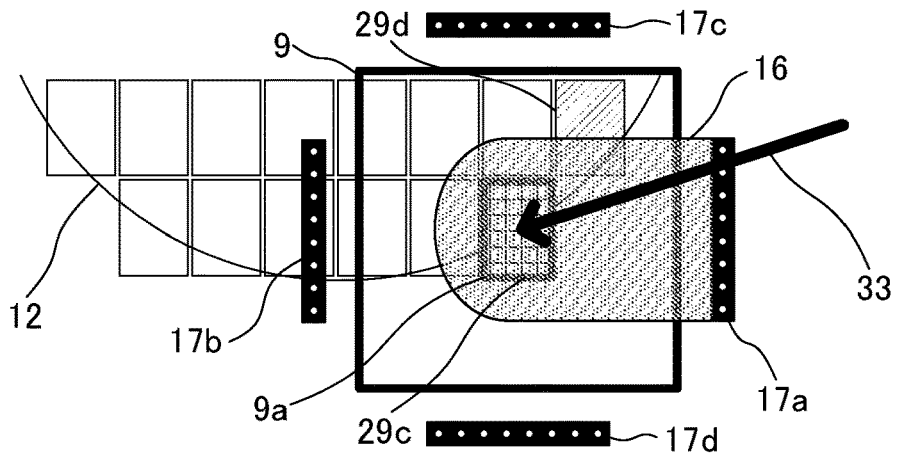
FIGS. 6A, 6B, and 6C illustrate operation examples when the substrate driving directions are changed according to the present embodiment.
Figure 6B:
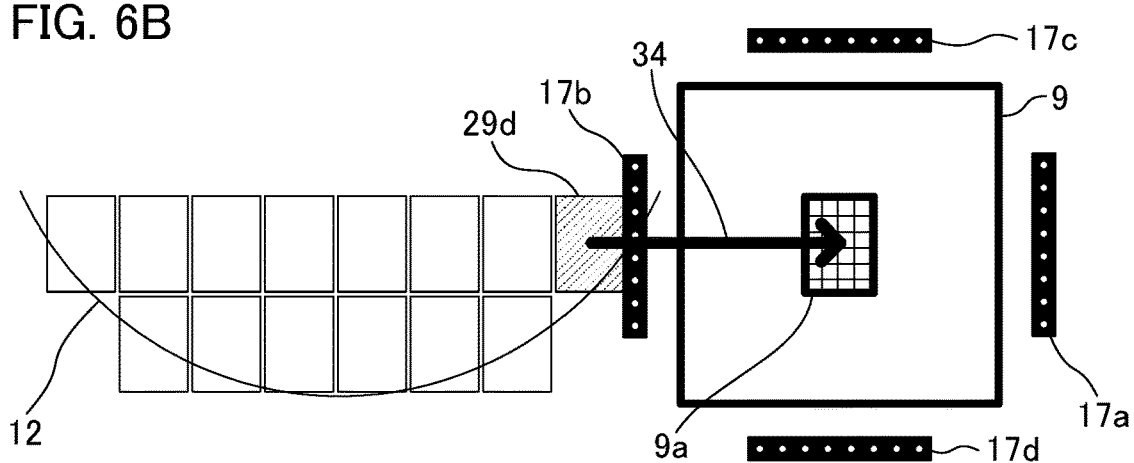

Accordingly, in the present embodiment, after the imprint processing is performed on the target shot region 29c, the controller 6 drives the substrate holding unit 5 in the driving direction 33 as shown in FIG. 6A. FIG. 6 illustrates an operation example of the present embodiment when the substrate driving direction is changed, and FIG. 6B illustrates a positional relation after driving. As shown in FIG. 6B, the present embodiment is characterized in that the target shot region 29d and the pattern region 9a are arranged to align with each other across the gas supply port 17b.

Subsequently, the controller 6 drives the substrate holding unit 5 in the direction of the driving direction 34 in order to move the target shot region 29d immediately under the pattern region 9a. In the present embodiment, as shown in FIG. 6B, the target shot region 29d, the gas supply port 17b, and the pattern region 9a are temporarily arranged in this order from the upstream of the driving direction 34. Accordingly, the replacement gas 16 is drawn in the driving direction of the substrate holding unit 5 by driving the substrate holding unit 5 directly under the pattern region 9a while supplying the replacement gas 16 from the gas supply port 17b.

Figure 6C:
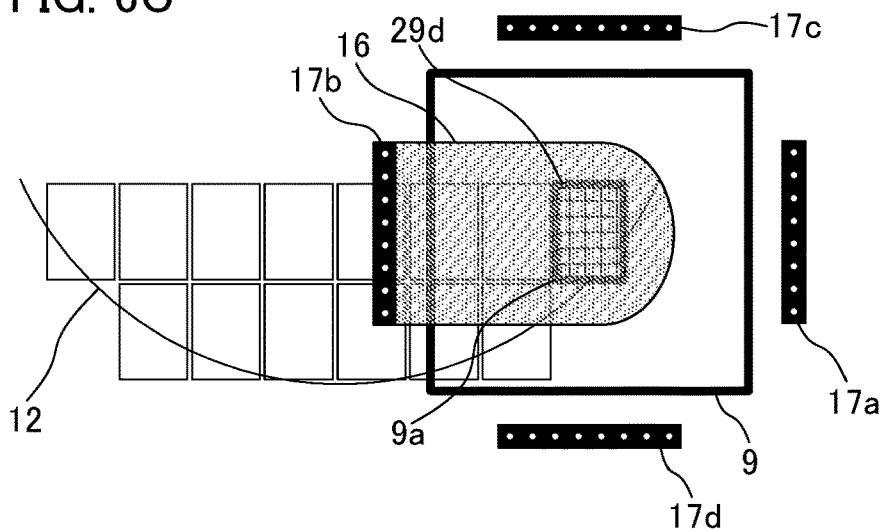

The state at this time is shown in FIG. 6C. As shown in FIG. 6C, the space between the pattern region 9a and the target shot region 29d is filled with the replacement gas 16 at a sufficient concentration, and thereby the imprint processing can be quickly executed in a state in which defects are less likely to occur. Subsequently, the imprint processing is sequentially perforated in the same manner on the remaining unprocessed shot regions on the left side of the target shot region 29d while moving the substrate along the driving direction 34. After the imprinting processing has been performed on all the target shot regions on the substrate, the substrate 12 is carried out.

Thus, the substrate is moved to the position shown in FIG. 6B when the substrate is moved in the driving direction 34 for the target shot region 29d where the first imprint processing is performed after the moving direction of the substrate is changed after the imprint processing is performed on the target shot region 29c. The substrate is moved to the position where the target shot region 29d, the gas supply port 17b, and the pattern region 9a are arranged in this order from the upstream of the driving direction 34, then the substrate is moved in the driving direction 34 while supplying the replacement gas from the gas supply port, and then the imprint processing for the target shot region 29d is performed.

Next, FIG. 7 is a flow chart showing the processes of the gas supply step, and a flow from the step of the pattern formation for the previous shot region to the step of pattern formation for the next target shot region 29 in the present embodiment will be described with reference to FIG. 7. The flow of FIG. 7 shows a control step executed by the controller 6 based on a computer program stored in a memory (not illustrated).

First, in step S101, after the pattern formation for the previous shot region, the controller 6 determines whether or not a driving direction for moving the next target shot region 29 toward directly under the pattern region 9a is the same as the driving direction when the previous shot region has been moved toward directly under the pattern region 9a. If the driving directions are the same, the process proceeds to step S103 (refer to FIG. 4). If the driving directions are not the same, the process proceeds to step S102 (refer to FIG. 6). If the target shot region 29 is the first shot region of the substrate 12 after the substrate is carried in, the process proceeds to step S102 (refer to FIG. 3).

In step S102, the substrate holding unit 5 is driven to be placed at, for example, the position shown in FIG. 3A or the position shown in FIG. 6B. Specifically, before the target shot region 29 is driven to face the pattern region 9a, the substrate 12 is temporarily moved to the position shown in FIG. 3A or the position shown in FIG. 6B so as to be arranged in the order of the target shot region 29, the gas supply port 17, and the pattern region 9a from the upstream in the driving direction of the substrate holding unit 5.

In step 103, the supply of the replacement gas 16 from the gas supply port starts. At this time, the controller 6 selects at least a gas supply port located upstream of the substrate holding unit 5 in the driving direction from among the gas supply ports 17a, 17b, 17c, and 17d. Subsequently, in step S104, the controller 6 drives the substrate holding unit 5 while drawing the replacement gas 16 into the space between the mold 9, the substrate 12, and the substrate holding unit 5 so that the target shot region 29 is located directly under the pattern region 9a.

In step S105, a pattern forming step (imprint processing) is performed on the target shot region 29. When step S105 is completed, the controller 6 determines whether or not an unprocessed shot region exists on the substrate 12, and if unprocessed shot region does not exist, the process shifts to the next step such as the transfer of the substrate.

In the present embodiment, although, in FIG. 3 to FIG. 6, the description has been given of the example in which the imprint processing is sequentially performed in the horizontal direction, the imprint processing may be performed in the vertical direction, or in the vertical and horizontal directions alternately. In the imprint processing performed in the vertical direction, the controller 6 selects a gas supply port located on the upstream side of the pattern region 9a in the driving direction of the substrate bolding unit 5 from among the gas supply ports 17c and 17d.

When the gas supply port is selected, the gas may be supplied not only from one gas supply port located on the upstream side, but also from a gas supply port in the vicinity of the one gas supply port. Accordingly, the replacement gas at a sufficient concentration can be obtained more quickly.

Thus, in the imprint apparatus 1, the replacement gas 16 is supplied to the space between the mold 9 and the substrate 12 by the gas supply unit 4 in order to suppress the occurrence of unfilled portions in the pattern of the imprint material 11 being formed on the substrate 12.

At this time, even if the target shot region 29 exists at any position on the substrate 12, control is performed such that the replacement gas 16 is supplied while the target shot region 29 is passing directly under the gas supply port as described above, and as a result, the concentration of the replacement gas 16 can be maintained at a sufficient concentration. Consequently, the imprint processing can be executed in a short time while maintaining a sufficient concentration for the replacement gas 16 even when imprinting is performed in the first shot region, or when imprinting is continuously performed while changing the driving direction over a plurality of shot regions.

As a result for using the imprint apparatus in the present embodiment, productivity in manufacturing articles such as microdevices including a semiconductor device and components having a microstructure is increased. A manufacturing method of a device (for example, a semiconductor device, a magnetic storage media, and a liquid crystal display device) as articles will be described.

Such a manufacturing method may include a step of forming a pattern of a mold on the surface of a substrate (for example, a wafer, a glass plate, and a film-like substrate) by using the imprint apparatus. The step of transferring a mold pattern may include a flattening step. Additionally, the substrate is not limited to a substrate made of a single base material and may include a substrate having a multilayer structure. The manufacturing method further includes a step of processing the substrate before or after the step of forming a pattern of a mold. For example, the processing step may include a step of removing a remaining film of the pattern and a developing step.

The manufacturing method may also include known steps such as a step of etching the substrate by using the pattern as a mask, a step of cutting a chip from the substrate (dicing), a step of placing the chip on the frame and electrically connecting it (bonding), and a step of sealing with a resin (molding). The article manufacturing method using the imprint apparatus according to the present embodiment is advantageous in at least one of the performance, quality, productivity, and production cost of the article as compared with the conventional method.

While the present invention has been described with reference to exemplary embodiments, it is to be understood that the invention is not limited to the disclosed exemplary embodiments. The scope of the following claims is to be accorded the broadest interpretation to encompass all such modifications and equivalent structures and functions.

In addition, as a part or the whole of the control according to this embodiment, a computer program realizing the function of the embodiment described above may be supplied to the imprint apparatus through a network or various storage media. Then, a computer (or a CPU, an MPU, or the like) of the imprint apparatus may be configured to read and execute the program. In such a case, the program and the storage medium storing the program configure the present invention.

This application claims the benefit of Japanese Patent Application No. 2020-filed on Dec. 11, 2020, which is hereby incorporated by reference herein in its entirety.

What is claimed is:

1. An imprint apparatus that performs imprint processing for forming a pattern by bringing a pattern region of a mold into contact with an imprint material on a shot region, the imprint processing being sequentially performed on each of a plurality of shot regions of a substrate, wherein the shot regions are arranged in a first axis direction and in a second axis direction perpendicular to the first direction, the imprint apparatus comprising:
   a substrate driving unit including a motor for moving the substrate along the first axis direction and the second axis direction;
   a plurality of gas supply ports including a first gas supply port and a second gas supply port provided at a periphery of the pattern region and configured to supply gas to a space between the pattern region and the substrate; and
   at least one processor or circuit configured to function as a control unit configured to perform control to:
      for a next target shot region that is arranged in the first axis direction corresponding to a previous driving direction of the substrate when a previous shot region has been moved toward directly under the pattern region along the first axis direction, move the substrate along the previous driving direction while gas is supplied from the first gas supply port when the next target region is passing the first gas supply port, until the next target shot region and the pattern region face each other, to provide a predetermined concentration of gas in the space;
      for the next target shot region that is arranged in the second axis direction different from the previous driving direction of the substrate, first move the substrate along both the first axis direction and the second axis direction so that the next target shot region, the second gas supply port, and the pattern region of the mold are in line in this order from an upstream of a second driving direction along the first axis direction for moving the next target shot region toward directly under the pattern region and then move the substrate in the second driving direction of the next target shot region along the first axis direction by the substrate driving unit while gas is supplied from the second gas supply port when the next target region is passing the second gas supply port, until the next target shot region and the pattern region face each other, to provide the predetermined concentration of gas in the space; and bring the pattern region into contact with the imprint material on the next target shot region of the substrate.

2. The imprint apparatus according to claim 1, wherein the control unit is further configured to perform control so as to supply the gas from at least a gas supply port disposed between the target shot region and the pattern region from among the plurality of gas supply ports.

3. The imprint apparatus according to claim 1, wherein the control unit is further configured to perform control to supply the gas from at least one of the plurality of gas supply ports even during the imprint processing.

4. The imprint apparatus according to claim 1, wherein, just before the driving direction of the substrate by the substrate drive unit is changed, the imprint processing for another target shot region is performed.

5. The imprint apparatus according to claim 1,
wherein, just before the driving direction of the substrate by the substrate drive unit is changed, the substrate is conveyed in the imprint apparatus.

6. The imprint apparatus according to claim 1, wherein the gas is also supplied by at least one of the plurality of gas supply ports before the next target shot region is passing the at least one of the plurality of gas supply ports.

7. The imprint apparatus according to claim 1, wherein the control unit is further configured to cause the substrate drive unit to move the substrate in the first axis direction while supplying the gas through at least one of the plurality of gas supply ports so that a Couette flow is generated to draw the gas under the pattern region.

8. The imprint apparatus according to claim 1, wherein the gas comprises at least one of helium, hydrogen, pentafluoropropane, hydrofluorocarbon, and hydrofluoroether.

9. An imprint method for controlling an imprint apparatus that performs imprint processing for forming a pattern by bringing a pattern region of a mold into contact with an imprint material on a shot region, the imprint processing being sequentially performed on each of a plurality of shot regions of a substrate, wherein the shot regions are arranged in a first axis direction and in a second axis direction perpendicular to the first direction, wherein the imprint apparatus includes a substrate drive unit including a motor for moving the substrate along the first axis direction and the second axis direction, and a plurality of gas supply ports including a first gas supply port and a second gas supply port for supplying gas to a space between the pattern region and the substrate, which is provided at a periphery of the pattern region, the imprint method comprising:

performing control to, for a next target shot region that is arranged in the first axis direction corresponding to a previous driving direction of the substrate when a previous shot region has been moved toward directly under the pattern region along the first axis direction, move the substrate along the previous driving direction while gas is supplied from the first gas supply port when the next target region is passing the first gas supply port, until the next target shot region and the pattern region face each other, to provide a predetermined concentration of gas in the space;

performing control to, for the next target shot region that is arranged in the second axis direction different from the previous driving direction of the substrate, first move the substrate along both the first axis direction and the second axis direction so that the next target shot region, the second gas supply port, and the pattern region of the mold are in line in this order from an upstream of a second driving direction along the first axis direction for moving the next target shot region toward directly under the pattern region and then move the substrate in the second driving direction of the next target shot region along the first axis direction by the substrate driving unit while gas is supplied from the second gas supply port when the next target region is passing the second gas supply port, until the next target shot region and the pattern region face each other, to provide the predetermined concentration of gas in the space; and performing control to bring the pattern region into contact with the imprint material on the next target shot region of the substrate.

* * * * *